United States Patent
Lin et al.

(10) Patent No.: US 6,534,852 B1
(45) Date of Patent: Mar. 18, 2003

(54) BALL GRID ARRAY SEMICONDUCTOR PACKAGE WITH IMPROVED STRENGTH AND ELECTRIC PERFORMANCE AND METHOD FOR MAKING THE SAME

(75) Inventors: Chun Hung Lin, Kaohsiung (TW); I Zeng Lee, Kaohsiung Hsien (TW); Su Tao, Kaohsiung (TW); Kun-Ching Chen, Tainan (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/547,096

(22) Filed: Apr. 11, 2000

(51) Int. Cl.[7] .................... H01L 23/52; H01L 23/48; H01L 29/40
(52) U.S. Cl. ................ 257/691; 257/690; 257/698; 257/737; 257/738; 257/784; 257/701; 257/780; 257/734
(58) Field of Search ............................... 257/690, 691, 257/698, 737, 738, 780, 784, 701

(56) References Cited

U.S. PATENT DOCUMENTS

| | | | | |
|---|---|---|---|---|
| 5,134,246 A | * | 7/1992 | Beppu et al. | 174/52.4 |
| 5,399,902 A | * | 3/1995 | Bickford et al. | 257/659 |
| 5,677,575 A | * | 10/1997 | Maeta et al. | 257/778 |
| 5,796,589 A | | 8/1998 | Barrow | |
| 5,798,909 A | * | 8/1998 | Bhatt et al. | 361/764 |
| 5,864,470 A | * | 1/1999 | Shim et al. | 361/777 |
| 5,866,949 A | * | 2/1999 | Schueller | 257/778 |
| 5,945,741 A | | 8/1999 | Ohsawa et al. | |
| 5,990,547 A | * | 11/1999 | Sharma et al. | 257/700 |
| 6,060,774 A | * | 5/2000 | Trui | 257/692 |
| 6,081,026 A | * | 6/2000 | Wang et al. | 257/700 |
| 6,140,710 A | * | 10/2000 | Greenberg | 257/786 |
| 6,172,305 B1 | * | 1/2001 | Tanahashi | 174/255 |
| 6,204,559 B1 | * | 3/2001 | Lin et al. | 257/738 |
| 2001/0011767 A1 | * | 8/2001 | Osawa et al. | 257/691 |

* cited by examiner

*Primary Examiner*—Tom Thomas
*Assistant Examiner*—Nitin Parekh (57) ABSTRACT

Disclosed are metal reinforced layers disposed at the upper and lower surfaces of the thin substrate to reinforce the strength of the thin substrate. With reinforced strength, the thin substrate is not susceptible to deform due to temperature fluctuation during packaging process, and thus the warpage for the semiconductor package is significantly eliminated. According to another aspect of the present invention, the metal reinforced layer at the lower surface of the thin substrate is functioned as a ground plane for the ball grid array (BGA) semiconductor package for better grounding effect. The present invention provides an optimal design for the return current path and impedance matching control. Besides, in high frequency application, the metal reinforced layer also can reduce the noise and cross talk among the signal lines of the ball grid array (BGA) semiconductor package.

10 Claims, 6 Drawing Sheets

BALL GRID ARRAY SEMICONDUCTOR PACKAGE WITH IMPROVED STRENGTH AND ELECTRIC PERFORMANCE AND METHOD FOR MAKING THE SAME

BACKGROUND OF THE INVENTION

1. Field of the Invention

This invention generally relates to a semiconductor package, and more particularly to a ball grid array (BGA) semiconductor package with improved thin substrate strength and electric performance.

2. Description of the Related Art

As the need for lighter and more complicated semiconductor devices becomes greater day by day, the semiconductor chips have become more and more complex thereby requiring more electrical connections. Therefore, the ball grid array (BGA) has been developed by the semiconductor chip packaging industry to meet these needs.

Figure 1:
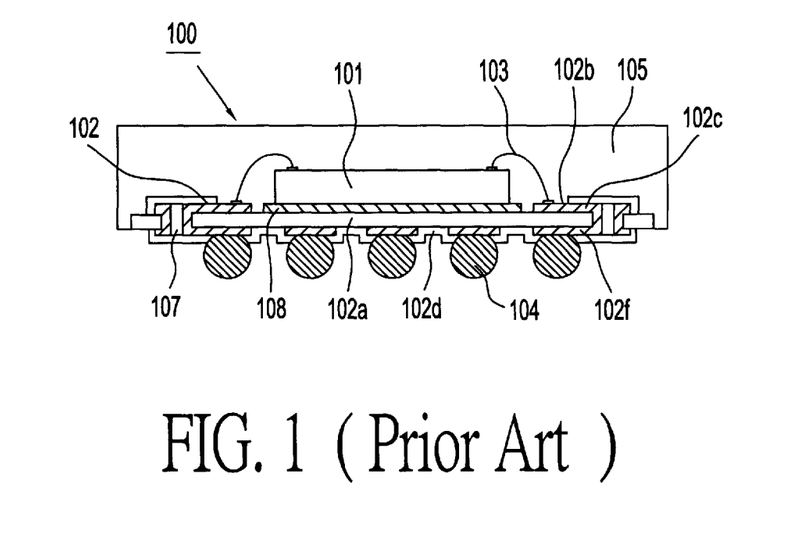
FIG. 1 is a cross sectional view of a conventional BGA semiconductor chip package.

FIG. 1 depicts a conventional BGA semiconductor chip package 100 including a chip 101 attached on a substrate 102 having a dielectric layer 101a. The chip pads on the active surface of the chip 101 are connected to conductive traces 101c disposed on the upper surface 101b of the dielectric layer 101a by bonding wires 103 and the conductive traces 101c are electrically connected through the through holes 107 to the solder ball pads 101f disposed on the lower surface 101d of the dielectric layer 101a. Each solder ball pads 101f has a solder ball 104 mounted thereon for electrical connection to outer circuit, such as a printed circuit board. A package body 105 encapsulates the chip 101, bonding wires 103 and the substrate 102.

The dielectric layer 101a of the substrate 102 is generally made of fiberglass reinforced bismaleimide-triazine (BT) resin, FR-4 fiberglass reinforced BT epoxy resin or polyimide and the thickness of the substrate 102 is about 0.56 mm. A copper die pad 108 is disposed on the central surface of the substrate 102 for carrying the chip 101. The through holes (vias) 107 are arranged around the die pad 108.

However, the overall volume of the above BGA semiconductor chip package 100 is too large to meet the packaging requirements for high density semiconductor chip. Accordingly, the packaging industry further develops a chip sized package (CSP) technology to meet the packaging requirements for high density semiconductor chip. Generally, the overall dimension of the chip sized package is smaller than 1.2 times of the chip dimension so as to increase the packaging density.

Figure 2:
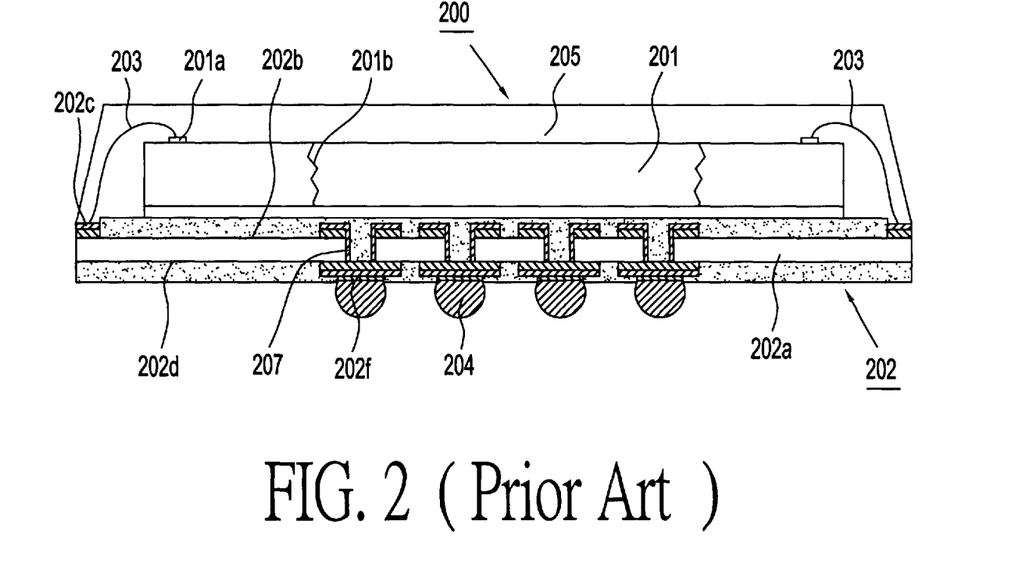
FIG. 2 is a cross sectional view of a conventional CSP semiconductor chip package.

FIG. 2 illustrates a conventional CSP semiconductor chip package 200 including a chip 201 attached on a substrate 202 having a dielectric layer 202a. The chip pads 201a on the active surface of the chip 201 are connected to conductive traces 202c disposed on the upper surface 202b of the dielectric layer 202a by bonding wires 203 and the conductive traces 202c are electrically connected through the through holes (vias) 207 to the solder ball pads 202f disposed on the lower surface 202d of the dielectric layer 202a. Each solder ball pads 202f has a solder ball 204 mounted thereon for electrical connection to outer circuit, such as a printed circuit board. A package body 205 encapsulates the chip 201, bonding wires 203 and the substrate 202. According to the CSP semiconductor chip package 200, the area surrounded by the solder balls is usually smaller than the area of the chip 201.

According to the CSP semiconductor chip package 200 as shown in FIG. 2, the thickness of the substrate 202 is about 0.36 mm or less than 0.36 mm and the through holes (vias) 207 of the substrate 202 are arranged within the periphery of the chip 201. At room temperature, the Storage Modulus (E') of the fiberglass reinforced bismaleimide-triazine (BT) resin for the substrate is about 7,000–9,000 MPa, while the Young's Modulus (E) of copper for the plated through holes (vias) 207 is about 110,000 MPa. During resin molding (about 175° C.), the Storage Modulus (E') of the BT substrate is about 2,000–3,000 MPa, while the Young's Modulus (E) of copper for the plated through holes (vias) 207 is about 103,000 MPa.

Therefore, during resin molding (about 175° C.), the ratio of the copper's Young's Modulus (E) to the BT's Storage Modulus (E') increases from 15 to 500 such that the BT substrate 202 without vias 207 is relatively softer than the BT substrate 202 with vias 207 and the area of BT substrate 202 without vias 207 is unable to provide sufficient strength for supporting chip 201. Besides, since the chip 201 is not supported by the die pad, in the CSP package, stress caused by molding pressure will exert on the edge 201b of the chip 201 and the chip will crack at the edge 201b area. This will lower the yield for production. Besides, the thin substrate 202 is susceptible to deform due to temperature fluctuation during post-curing process, which will result in warpage for the semiconductor package. Furthermore, since the ground plane for the conventional substrate 202 is relative small, it is difficult to achieve optimal design for the return current path and impedance matching control to reduce signal coupling and noise.

Accordingly, there is a need for the packaging industry for eliminating the die crack, warpage and electric problems for the chip sized package with thin substrate.

SUMMARY OF THE INVENTION

It is a primary object of the present invention to provide a ball grid array (BGA) semiconductor package with improved thin substrate strength and electric performance, wherein at least one metal reinforced layer is provided at the lower surface of the substrate to enhance the strength thereof so as to prevent the die from cracking during packaging process.

It is a secondary object of the present invention to provide a ball grid array (BGA) semiconductor package with improved thin substrate strength and electric performance, wherein at least one metal reinforced layer is provided at the lower surface of the substrate as a ground plane to improve the electrical performance of the BGA semiconductor package.

It is another object of the present invention to provide a method for manufacturing a ball grid array (BGA) semiconductor package with improved thin substrate strength and electric performance, wherein at least one metal reinforced layer is provided at the lower surface of the substrate to enhance the strength thereof so as to prevent the die from cracking during packaging process.

It is a further object of the present invention to provide a method for manufacturing a ball grid array (BGA) semiconductor package with improved thin substrate strength and electric performance, wherein at least one metal reinforced layer is provided at the lower surface of the substrate as a ground plane to improve the electrical performance of the BGA semiconductor package.

To achieve the above objects, the present invention disposes at least one metal reinforced layer, preferably a copper mesh layer, at the lower surface of the thin substrate around the solder balls to reinforce the strength of the thin substrate.

With reinforced strength, the thin substrate is not susceptible to deform due to temperature fluctuation during packaging process, and thus the warpage for the semiconductor package is significantly eliminated. The present invention further disposes at least one metal reinforced layer, preferably a copper mesh layer, at the upper surface of the thin substrate around the vias and traces to reinforce the strength of the thin substrate. When the chip is mounted on the substrate, the copper mesh lies under the edges of the chip for supporting the chip during molding process such that the die crack problem is eliminated.

According to another aspect of the present invention, the metal reinforced layer at the lower surface of the thin substrate is functioned as a ground plane for the ball grid array (BGA) semiconductor package for better grounding effect. Since the solder balls are concentrated at the central portion of the lower surface of the thin substrate, there is larger area for the metal reinforced layer, thereby providing an optimal design for the return current path and impedance matching control. Besides, the solder balls connecting to the power source can be disposed close to the metal reinforced layer so as to reduce the signal coupling, and the solder balls connecting to the signal lines can be disposed close to the metal reinforced layer so as to increase the loading capacitance. In high frequency application, the metal reinforced layer also can reduce the noise and cross talk among the signal lines of the ball grid array (BGA) semiconductor package. Accordingly, the present invention significantly improves the electrical performance for the ball grid array (BGA) semiconductor package.

DETAILED DESCRIPTION OF THE PREFERRED EMBODIMENT

Figure 6:
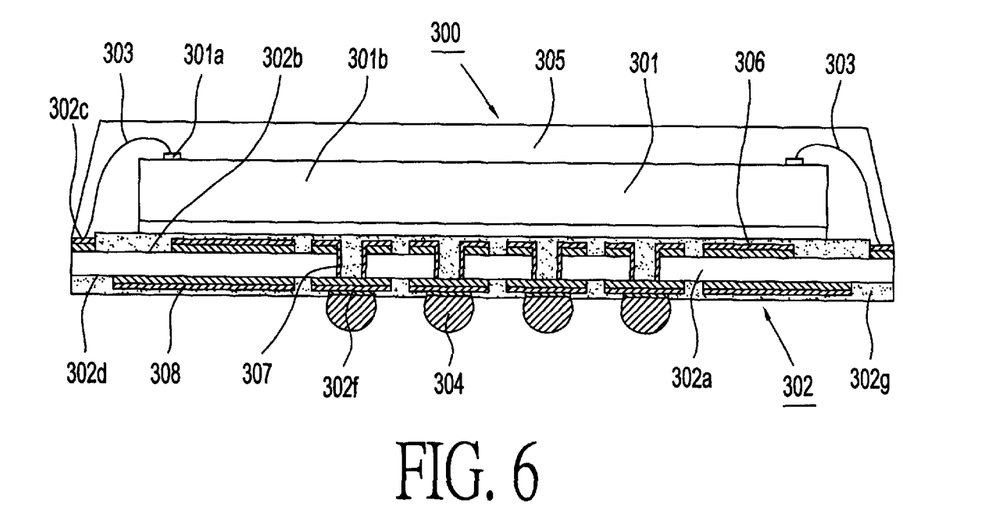
FIG. 6 is a cross section of the ball grid array (BGA) semiconductor package in accordance with a first embodiment of the present invention.

Referring to FIG. 6 first, it shows a cross sectional view of a ball grid array (BGA) semiconductor package 300 with improved thin substrate strength and electrical performance in accordance with the present invention. The semiconductor chip package 300 includes a chip 301 attached on a substrate 302 by a nonconductive adhesive 310, such as epoxy. The substrate has a dielectric layer 302a. The chip pads 301a on the active surface of the chip 301 are connected to bonding pads 302c disposed on the upper surface 302b of the dielectric layer 302a by bonding wires 303 and the bonding pads 302c are electrically connected through the through holes (via) 307 to the solder ball pads 302f disposed on the lower surface 302d of the dielectric layer 302a. The through holes (vias) 307 are separated from the solder pads 302f in a "offset" or "dogbone" configuration. Preferably, the through holes (vias) 307 are arranged above the solder pads 302f in a "via on pad" configuration so as to increase the density for the traces layout. Each solder ball pads 302f has a solder ball 304 mounted thereon for electrical connection to outer circuit, such as a printed circuit board. A package body 305 encapsulates the chip 301, bonding wires 303 and the substrate 302. According to the semiconductor chip package 300, the area surrounded by the solder balls is usually smaller than the area of the chip 301.

The dielectric layer 302a of the substrate 302 is generally made of fiberglass reinforced bismaleimide-triazine (BT) resin, FR-4 fiberglass reinforced BT epoxy resin or polyimide. Vias 307 are formed on the dielectric layer 302a of the substrate 302 by mechanical drilling or laser ablation and are plated with a metal layer, such as copper. The present invention disposes at least one metal reinforced layer 308, preferably a copper mesh layer, at the lower surface 302d of the thin substrate 302 around the solder balls 304 to reinforce the strength of the thin substrate 302. With reinforced strength, the thin substrate 302 is not susceptible to deform due to temperature fluctuation during packaging process, and thus the warpage for the semiconductor package is significantly eliminated. The present invention further disposes at least one metal reinforced layer 306, preferably a copper mesh layer, at the upper surface 302b of the thin substrate 302 around the vias 307 and traces 309 to reinforce the strength of the thin substrate 302. When the chip 301 is mounted on the substrate 302, the copper mesh lies under the edges of the chip 301 for supporting the chip during molding process such that the die crack problem is eliminated. A protective layer 302g, such as a photoimagable solder mask, is coated on the upper and lower surfaces of the substrate 302. Then, the predetermined areas of solder mask are pattern transferred and developed by photolithography in a manner that the bonding pads 302c on the upper surface 302b and the solder pads 302f on the lower surface 302d are not coated with the solder mask.

Figure 3:
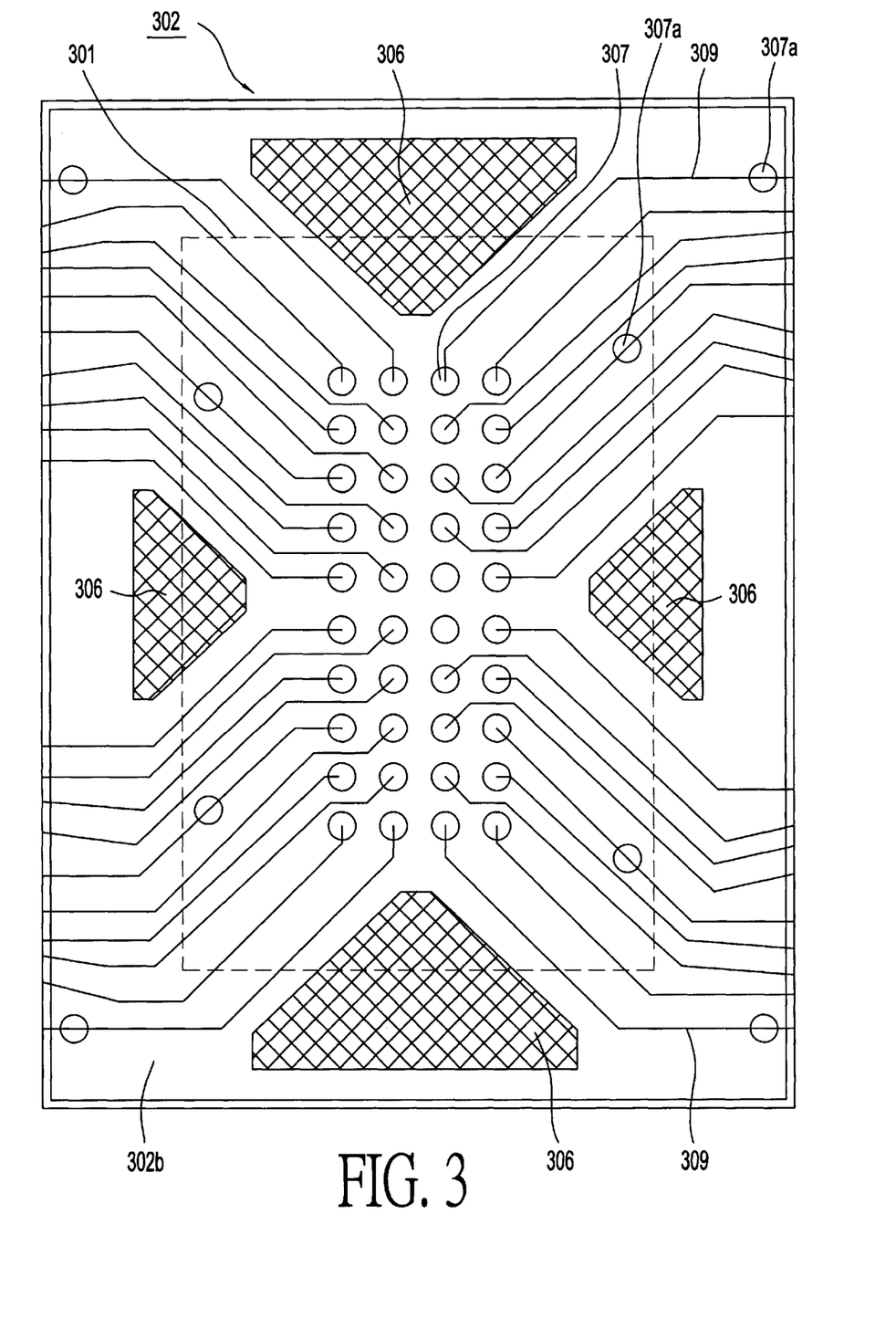
FIG. 3 is a top plan view of the ball grid array (BGA) semiconductor package substrate, showing that metal reinforced layers are provided at the upper surface of the thin substrate around the vias and traces to reinforce the strength of the thin substrate.

FIG. 3 shows a top plan view of the ball grid array (BGA) semiconductor package substrate 302. According to the present invention, at least one metal reinforced layer 306 is disposed at the upper surface 302b of the thin substrate 302 around the vias 307 and traces 309 to reinforce the strength of the thin substrate 302. As shown in FIG. 3, there are four metal reinforced layers 306 disposed at the upper surface 302b of the thin substrate 302 around the vias 307 and traces 309. It should be understood that the metal reinforced layers 306 is disposed on the upper surface 302b of the thin substrate 302 according to the vias 307 and traces 309. The metal reinforced layers 306 is used to enhance the strength of the substrate 302, and the metal reinforced layers 306 is preferably a copper layer, and more preferably, a copper mesh which is consisted of crossed copper strips of 100 µm in width spaced 200 µm with each other. When the chip 301 is attached onto the substrate 302, the metal reinforced layers 306 are disposed under the four edges of the chip 301 so as to provide supporting forces for the chip 301. According to the present invention, since the metal reinforced layers 306 provide supporting forces the four edges for the chip 301, the die crack problem will be significantly reduced during the resin molding process. Besides, the present invention also moves at least one ground via 307a on the upper surface 302b of the substrate 302 to a location under the edges of the chip 301 so as to provide supporting forces for the chip 301 to reduce the die crack problem. Preferably, partial ground vias 307a or all of the ground vias 307a are moved, according to the layout design of the substrate 302, to the location under the edges of the chip 301 so as to provide supporting forces for the chip 301 to reduce the die crack problem.

Figure 4:
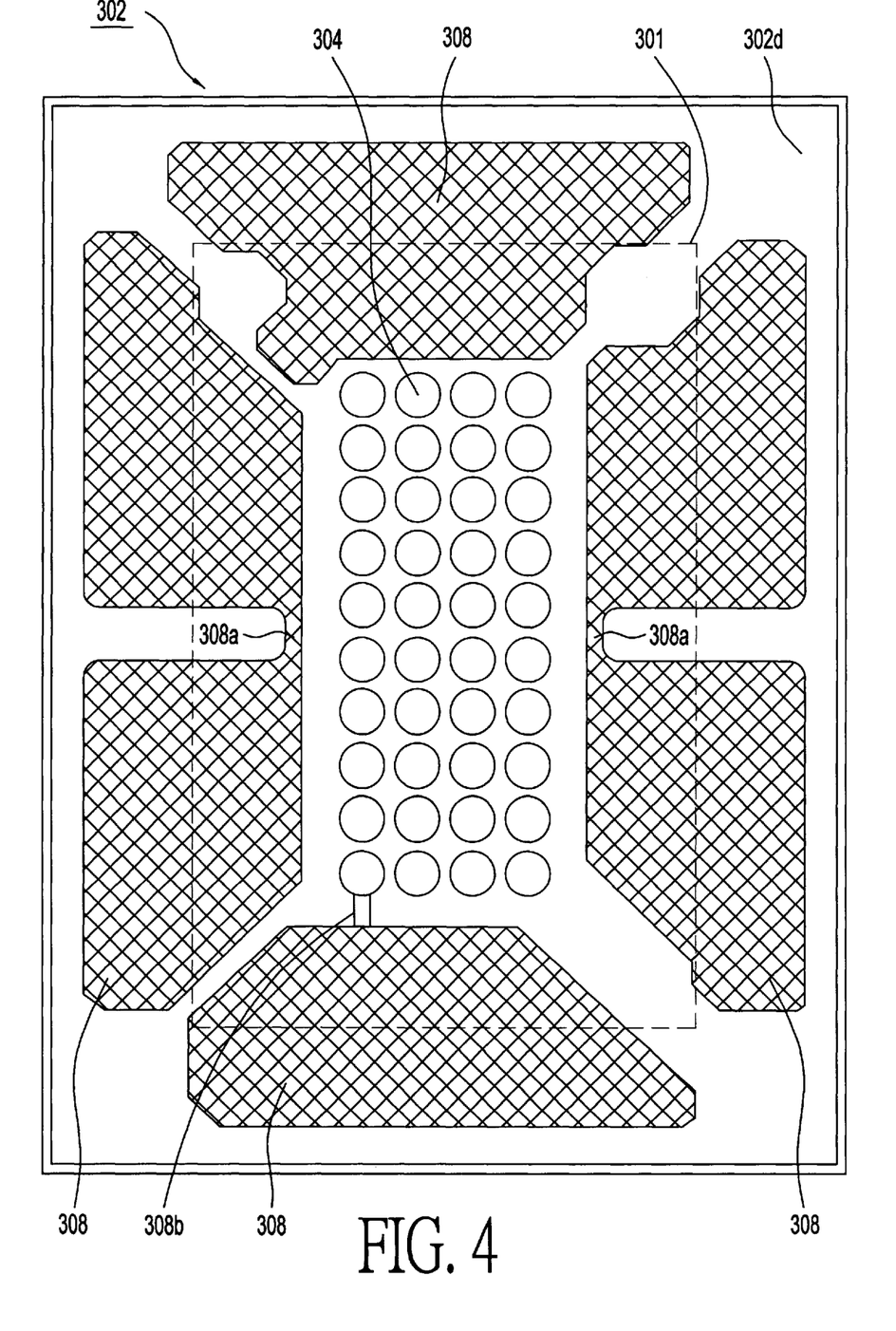
FIG. 4 is a bottom plan view of the ball grid array (BGA) semiconductor package substrate, showing that metal reinforced layers are provided at the lower surface of the thin substrate around the solder balls to reinforce the strength of the thin substrate and to function as a ground plane.

FIG. 4 shows a bottom plan view of the ball grid array (BGA) semiconductor package substrate 302. According to the present invention, at least one metal reinforced layer 308 is disposed at the lower surface 302d of the thin substrate 302 around the solder balls 304 to reinforce the strength of the thin substrate 302. It should be understood that, like the metal reinforced layers 306, the metal reinforced layers 308 is disposed on the lower surface 302d of the thin substrate 302 to enhance the strength of the substrate 302, and the metal reinforced layers 306 is preferably a copper layer, and more preferably, a copper mesh which is consisted of crossed copper strips of 100 µm in width spaced 200 µm with each other. For preventing the substrate 302 from deformation due to the thermal stress between the metal reinforced layers 308 and the substrate 302, the metal reinforced layers 308 is preferably divided into several separate units. Preferably, the metal reinforced layers 308 is divided into several separate units according to the distance from neutral point (DNP) of the substrate 302 so as to eliminate or reduce the thermal stress between the metal reinforced layers 308 and the substrate 302.

According to another aspect of the present invention, the metal reinforced layers 308 of the substrate 302 can serve the ground plane for the chip 301 of the ball grid array (BGA) semiconductor package 300. Each individual metal reinforced layer 308 can serve a single ground plane for the chip 301 or all the individual metal reinforced layers 308 are electrically connected through connecting wires 308a for providing better ground effect. In additions, as the present invention moves some ground vias 307a to the location under the edges of the chip 301 as shown in FIG. 3, the ground vias 307a can connect to the metal reinforced layers 308 as ground plane for providing better ground effect. As shown in FIG. 4, since the solder balls 304 are gathered together in the central area of the lower surface 302d of the thin substrate 302, there will be more sufficient space for the metal reinforced layers 308 such that the metal reinforced layers 308 can provide the optimal design for the return current path and impedance matching control. Besides, the solder balls 304 connecting to the power source can be disposed close to the metal reinforced layer 308 so as to reduce the signal coupling, and the solder balls 304 connecting to the signal lines can be disposed close to the metal reinforced layer 308 so as to increase the loading capacitance. In high frequency application, the metal reinforced layer 308 also can reduce the noise and cross talk among the signal lines of the ball grid array (BGA) semiconductor package. Accordingly, the present invention significantly improves the electrical performance for the ball grid array (BGA) semiconductor package.

Figure 7:
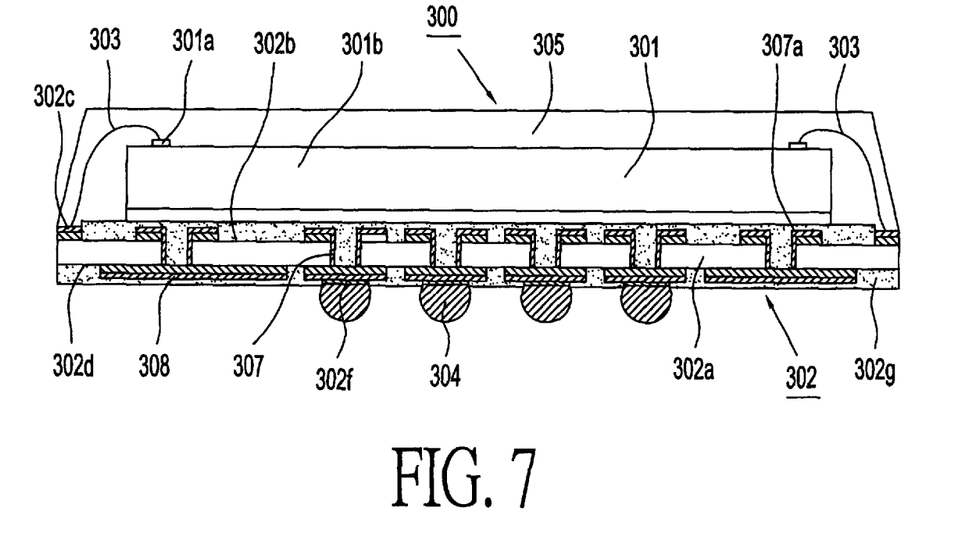
FIG. 7 is a cross section of the ball grid array (BGA) semiconductor package in accordance with a second embodiment of the present invention.

Referring to FIG. 7, it illustrates a cross section of the ball grid array (BGA) semiconductor package 300 in accordance with a second embodiment of the present invention. This embodiment is substantially the same as the ball grid array (BGA) semiconductor package 300 as shown in FIG. 6 and the difference lies in that at least one ground vias 307a are moved to the location under the edges of the chip 301 so as to provide supporting forces for the chip 301 to reduce the die crack problem. The ground vias 307a can connect to the metal reinforced layers 308 as ground plane for providing better ground effect.

Now referring to FIG. 5A–5F, illustrating the process for making the thin substrate 302 in accordance with the present invention.

Figure 5A:
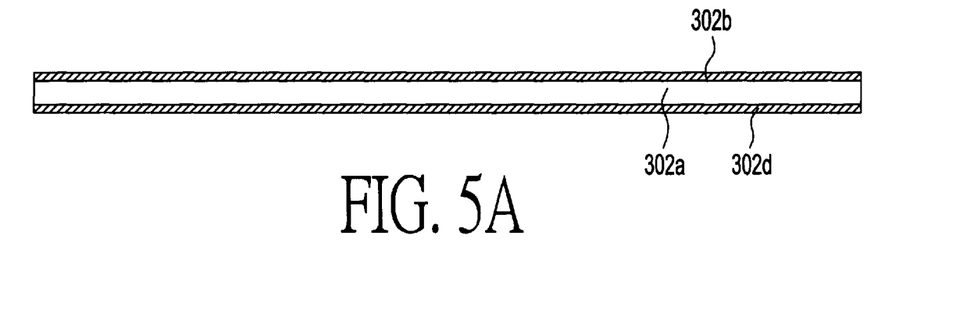
FIGS. 5A–5F are the process for making the thin substrate in accordance with the present invention.

Referring to FIG. 5A, a base material having the dielectric layer 302a is generally made of fiberglass reinforced bismaleimide-triazine (BT) resin, FR-4 fiberglass reinforced BT epoxy resin or polyimide. The base material has an upper surface 302b and a lower surface 302d.

Figure 5B:
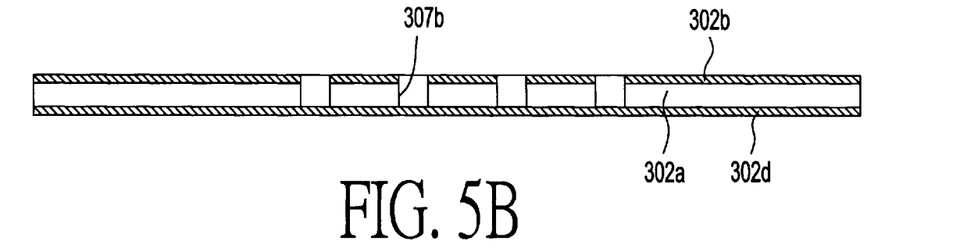

Referring to FIG. 5B, a plurality of holes 307b are formed in the base material from the upper surface 302b to the lower surface 302d. The holes 307b are formed by conventional techniques such as punching or laser drilling. The holes are formed at locations corresponding to the vias 307 and the solder pads 302f of the package 300.

Figure 5C:
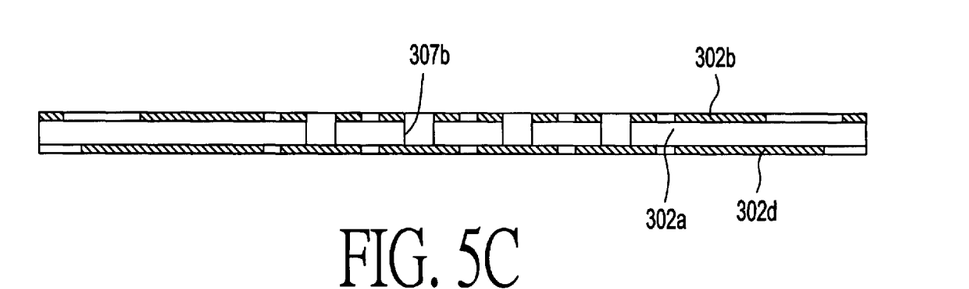

Referring to FIG. 5C, the chip connection pads 302c, the metal reinforced layer 306, the vias 307 and traces 309 on the upper surface 302b and the metal reinforced layer 308 and the vias 307 on the lower surface 302d are formed by photolithography and etching which comprise the steps of: (A) applying a photoresist layer on the upper surface 302b and the lower surface 302d; (B) pattern transferring by photolithography; (C) removing the unprotected portions to form the corresponding the chip connection pads 302c, the metal reinforced layer 306, the vias 307 and traces 309 on the upper surface 302b and the metal reinforced layer 308 and the vias 307 on the lower surface 302d by etching; and (D) removing the remaining photoresist layer.

Figure 5D:
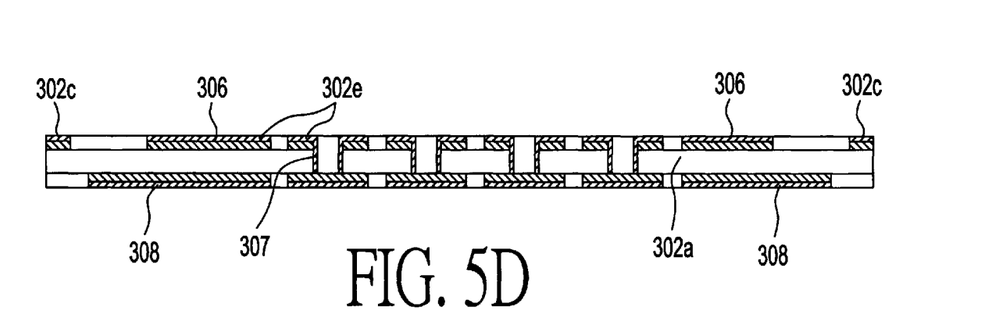

Referring to FIGS. 3, 4 and 5D, a metal layer 302e (such as a copper layer) is formed onto the upper surface 302b and the lower surface 302d of the base material. The metal layer 302e can be formed by plating process on the unetched area to form the chip connection pads 302c, the metal reinforced layer 306, the vias 307 and traces 309 on the upper surface 302b and the metal reinforced layer 308 and the vias 307 on the lower surface 302d. The metal reinforced layers 306 and 308 are used to enhance the strength of the substrate 302, and the metal reinforced layers 306 and 308 are preferably copper layers, and more preferably, copper meshes which are consisted of crossed copper strips of 100 µm in width spaced 200 µm with each other. Since the metal reinforced layers 306 and 308 are formed at the same time as the chip connection pads 302c, the vias 307 and traces 309, the manufacturing equipment, process and cost are not increased for the present invention.

Figure 5E:
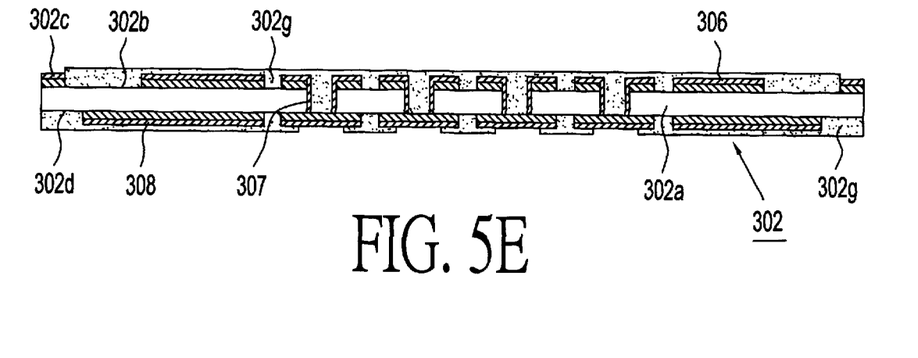

Referring to FIG. 5E, a protective layer 302g, such as a photoimagable solder mask, is coated onto the upper surface and the lower surface of the substrate 302. Then pattern transferring the photoimagable solder mask in a manner that the chip connection pads 302c on the upper surface 302b and the vias 307 on the lower surface 302d are not covered by the protective layer 302g.

Figure 5F:
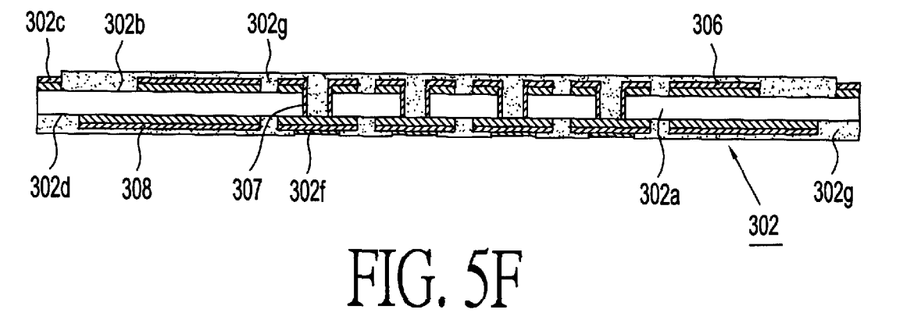

Referring to FIG. 5F, solder pads 302f are formed on the lower surfaces of the vias 307. The solder pads can be formed by conventional plating process. Preferably, a layer of nickel is plated thereon and then a layer of gold is plated on the nickel layer for easily mounting the solder balls 304 thereon.

According to one feature of the present invention, metal reinforced layers 306 and 308 are disposed at the upper and lower surfaces of the thin substrate 302 to reinforce the strength of the thin substrate 302. With reinforced strength, the thin substrate 302 is not susceptible to deform due to temperature fluctuation during packaging process, and thus the warpage for the semiconductor package is significantly eliminated. According to another aspect of the present invention, the metal reinforced layer 308 at the lower surface 302d of the thin substrate 302 is functioned as a ground plane for the ball grid array (BGA) semiconductor package 300 for better grounding effect. Since the solder balls are concentrated at the central portion of the lower surface of the thin substrate, there is larger area for the metal reinforced layer, thereby providing an optimal design for the return current path and impedance matching control. Besides, the solder balls connecting to the power source can be disposed close to the metal reinforced layer so as to reduce the signal coupling, and the solder balls connecting to the signal lines can be disposed close to the metal reinforced layer so as to increase the loading capacitance. In high frequency application, the metal reinforced layer also can reduce the noise and cross talk among the signal lines of the ball grid array (BGA) semiconductor package. Accordingly, the present invention significantly improves the electrical performance for the ball grid array (BGA) semiconductor package.

Although the invention has been explained in relation to its preferred embodiment, it is to be understood that many other possible modifications and variations can be made without departing from the spirit and scope of the invention as hereinafter claimed.

What is claimed is:

1. A semiconductor package, comprising:
   a substrate having:
      a dielectric layer having an upper surface and a lower surface;
      a plurality of bonding pads and traces disposed on the upper surface of the dielectric layer;
      a plurality of solder ball pads disposed on the lower surface of the dielectric layer;
      a plurality of vias each electrically connecting one of the solder ball pads to one of the bonding pads through one of the traces;
      at least a first metal reinforcing layer disposed on the lower surface of the substrate in regions where the solder ball pads are not formed to reinforce the strength of the substrate and to serve as a ground plane for the semiconductor package; and
      a protective layer coated on the upper surface and the lower surface of the substrate without covering the bonding pads on the upper surface and the solder ball pads on the lower surface;
   a plurality of solder balls each attached to one of the solder ball pads for connecting to external circuits;
   a chip attached to the substrate, and having a plurality of chip pads each electrically connected to one of the bonding pads;
   a package body encapsulating the chip and at least the upper surface of the substrate;
   wherein the first metal reinforcing layer is divided into a number of separate units according to the distance from neutral point (DNP) of the substrate.

2. A substrate for a semiconductor package, comprising:
   a dielectric layer having an upper surface and a lower surface;
   a plurality of bonding pads and traces disposed on the upper surface of the dielectric layer;
   a plurality of solder ball pads disposed on the lower surface of the dielectric layer;
   a plurality of vias each electrically connecting one of the solder ball pads to one of the bonding pads through one of the traces;
   at least a first metal reinforcing layer disposed on the lower surface of the substrate in regions where the solder ball pads are not formed to reinforce the strength of the substrate and to serve as a ground plane for the semiconductor package; and
   a protective layer coated on the upper surface and the lower surface of the substrate without covering the bonding pads on the upper surface and the solder ball pads on the lower surface;
   wherein the first metal reinforcing layer is divided into a number of separate units according to the distance from neutral point (DNP) of the substrate.

3. A semiconductor package, comprising:
   a substrate having:
      a dielectric layer having an upper surface and a lower surface;
      a plurality of bonding pads and traces disposed on the upper surface of the dielectric layer;
      a plurality of solder ball pads disposed on the lower surface of the dielectric layer;
      a plurality of vias each electrically connecting one of the solder ball pads to one of the bonding pads through one of the traces;
      at least a first metal reinforcing layer disposed on the lower surface of the substrate in regions where the solder ball pads are not formed to reinforce the strength of the substrate and to serve as a ground plane for the semiconductor package; and
      a protective layer coated on the upper surface and the lower surface of the substrate without covering the bonding pads on the upper surface and the solder ball pads on the lower surface;
   a plurality of solder balls each attached to one of the solder ball pads for connecting to external circuits;
   a chip attached to the substrate, and having a plurality of chip pads each electrically connected to one of the bonding pads; and
   a package body encapsulating the chip and at least the upper surface of the substrate;
   wherein the substrate is substantially rectangular in shape; and
   wherein the first metal reinforcing layer is disposed along sides of the substrate, and is not present in corner regions of the substrate.

4. A semiconductor package, comprising:
   a substrate having:
      a dielectric layer having an upper surface and a lower surface;
      a plurality of bonding pads and traces disposed on the upper surface of the dielectric layer;
      a plurality of solder ball pads disposed on the lower surface of the dielectric layer;
      a plurality of vias each electrically connecting one of the solder ball pads to one of the bonding pads through one of the traces;
      at least a first metal reinforcing layer disposed on the lower surface of the substrate in regions where the solder ball pads are not formed to reinforce the strength of the substrate and to serve as a ground plane for the semiconductor package; and
      a protective layer coated on the upper surface and the lower surface of the substrate without covering the bonding pads on the upper surface and the solder ball pads on the lower surface;
   a plurality of solder balls each attached to one of the solder ball pads for connecting to external circuits,
   a chip attached to the substrate, and having a plurality of chip pads each electrically connected to one of the bonding pads; and a package body encapsulating the chip and at least the upper surface of the substrate;

wherein the chip is attached to the upper surface of the substrate;

wherein the chip is attached to a die receiving area on the upper surface of the substrate, and the first metal reinforcing layer is at least partially disposed underneath the chip in a region of the lower surface of the substrate which corresponds to the die receiving area on the upper surface of the substrate.

5. A semiconductor package, comprising:

a substrate having:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package; and a protective layer coated on the upper surface and the lower surface of the substrate without covering the bonding pads on the upper surface and the solder ball pads on the lower surface;

a plurality of solder balls each attached to one of the solder ball pads for connecting to external circuits;

a chip attached to the substrate, and having a plurality of chip pads each electrically connected to one of the bonding pads;

a package body encapsulating the chip and at least the upper surface of the substrate; and a second metal reinforcing layer disposed on the upper surface of the substrate in regions where the vias and traces are not formed so as to enhance the substrate strength for supporting the chip;

wherein the chip is attached to a die receiving area on the upper surface of the substrate within which the bonding pads and traces are positioned, and the second metal reinforcing layer extends at least partially into the die receiving area to be present immediately underneath the chip.

6. A semiconductor package, comprising:

a substrate having:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package; and a protective layer coated on the upper surface and the lower surface of the substrate without covering the bonding pads on the upper surface and the solder ball pads on the lower surface;

a plurality of solder balls each attached to one of the solder ball pads for connecting to external circuits;

a chip attached to the substrate, and having a plurality of chip pads each electrically connected to one of the bonding pads;

a package body encapsulating the chip and at least the upper surface of the substrate; and a second metal reinforcing layer disposed on the upper surface of the substrate in regions where the vias and traces are not formed so as to enhance the substrate strength for supporting the chip;

wherein a total area of the first metal reinforcing layer is larger than that of the second metal reinforcing layer.

7. A substrate for a semiconductor package, comprising:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package; and a protective layer coated on the upper surface and the lower surface of the substrate without covering the bonding pads on the upper surface and the solder ball pads on the lower surface;

wherein the substrate is substantially rectangular in shape; and wherein the first metal reinforcing layer is disposed along sides of the substrate, and is not present in corner regions of the substrate.

8. A substrate for a semiconductor package, comprising:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package; and a protective layer coated on the upper surface and the lower surface of the substrate without covering the bonding pads on the upper surface and the solder ball pads on the lower surface;

wherein the bonding pads and traces are disposed in a die receiving area, for receiving a semiconductor chip, only the upper surface of the substrate, and the first metal reinforcing layer at least partially disposed in a region of the lower surface of the substrate which corresponds to the die receiving area on the upper surface of the substrate.

9. A substrate for a semiconductor package, comprising:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package;

a protective layer coated on the upper surface and the lower surface of the substrate without covering the bonding pads on the upper surface and the solder ball pads on the lower surface; and a second metal reinforcing layer disposed on the upper surface of the substrate in regions where the vias and traces are not formed so as to enhance the substrate strength;

wherein the bonding pads and traces are disposed in a die receiving area, for receiving a semiconductor chip, on the upper surface of the substrate, and the second metal reinforcing layer extends at least partially into the die receiving area to be present immediately underneath the chip when the chip is attached to the substrate.

10. A substrate for a semiconductor package, comprising:

a dielectric layer having an upper surface and a lower surface;

a plurality of bonding pads and traces disposed on the upper surface of the dielectric layer;

a plurality of solder ball pads disposed on the lower surface of the dielectric layer;

a plurality of vias each electrically connecting one of the solder ball pads to one of the bonding pads through one of the traces;

at least a first metal reinforcing layer disposed on the lower surface of the substrate in regions where the solder ball pads are not formed to reinforce the strength of the substrate and to serve as a ground plane for the semiconductor package;

a protective layer coated on the upper surface and the lower surface of the substrate without covering the bonding pads on the upper surface and the solder ball pads on the lower surface; and a second metal reinforcing layer disposed on the upper surface of the substrate in regions where the vias and traces are not formed so as to enhance the substrate strength;

wherein a total area of the first metal reinforcing layer is larger than that of the second metal reinforcing layer.

* * * * *